United States Patent [19]

Saida et al.

[11] Patent Number: 5,674,611
[45] Date of Patent: Oct. 7, 1997

[54] ADHESIVE FOR COPPER FOILS AND AN ADHESIVE-APPLIED COPPER FOIL

[75] Inventors: Muneo Saida, Tokyo; Muneharu Ohara, Hasuda; Teturoh Satoh, Ageo, all of Japan

[73] Assignee: Mitsui Mining Smelting Co., Ltd., Tokyo, Japan

[21] Appl. No.: 437,177

[22] Filed: May 8, 1995

[30] Foreign Application Priority Data

Jan. 18, 1995 [JP] Japan ................... 7-022321

[51] Int. Cl.$^6$ .................... B32B 7/12; B32B 15/04
[52] U.S. Cl. .................................................. 428/344
[58] Field of Search ............................... 428/344

[56] References Cited

U.S. PATENT DOCUMENTS

| | | | |
|---|---|---|---|
| 3,936,575 | 2/1976 | Watanabe et al. | 428/417 |
| 4,486,505 | 12/1984 | Fushiki et al. | 428/416 |
| 4,560,579 | 12/1985 | Siadat et al. | 427/45.1 |
| 4,586,976 | 5/1986 | Takano et al. | 156/233 |
| 4,593,052 | 6/1986 | Irving | 522/31 |
| 4,985,294 | 1/1991 | Watanabe et al. | 428/209 |
| 5,153,987 | 10/1992 | Takahashi et al. | 29/852 |
| 5,292,812 | 3/1994 | Yamazaki et al. | 525/112 |
| 5,365,656 | 11/1994 | Dahringer et al. | 29/840 |
| 5,403,869 | 4/1995 | Arike et al. | 522/25 |

*Primary Examiner*—Helen Lee
*Attorney, Agent, or Firm*—Morrison Law Firm

[57] ABSTRACT

An adhesive for copper foils which comprises 40–70% by weight of an epoxy resin, 20–50% by weight of a polyvinyl acetal resin and 0.1–20% weight of a melamine or urethane resin, all of said resins totalling 100% by weight, with the proviso that 5–80% by weight of said epoxy resin is a rubber-modified epoxy resin; and An adhesive-applied copper foil having said adhesive attached onto its one face.

5 Claims, No Drawings

મ5,674,611

ADHESIVE FOR COPPER FOILS AND AN ADHESIVE-APPLIED COPPER FOIL

BACKGROUND OF THE INVENTION

1. Field of the Invention

This invention relates to an adhesive for use in preparing a laminate for use in making a printed wiring board and also to said adhesive-copper foil.

2. Prior Art

Most of laminates for use in a printed wiring board which is employed in the electronic industry, may be prepared by impregnating glass cloth, kraft paper, nonwoven glass fabric or the like with a thermosetting resin such as a phenolic resin or an epoxy resin and heating the whole to semi-cure the impregnated resin thereby to obtain a prepreg in the semi-cured state, and then adhering a copper foil onto one or both surfaces of the prepreg.

To obtain a sufficient peel strength with a substrate copper foils used in the above case are those in which the matte (or rough) surface where electrodeposition of copper ended has been subjected to roughing treatment, if they are an electrodeposited copper foil.

In general, in a case where a substrate used is a prepreg impregnated with an epoxy resin, a copper foil only has to be subjected to such surface roughing treatment to effect a satisfactory bond between the copper foil and the substrate, whereas in a case where a substrate used is a prepreg impregnated with a phenolic resin, a copper foil only subjected to surface roughing treatment will not effect a practical bond with the substrate and, therefore, a copper foil is required to be subjected to surface roughing treatment, coated at the roughed surface with an adhesive and then dried to obtain an adhesive-applied copper foil provided with a semi-cured adhesive layer In order to ensure a secure bond with the substrate. The laminates so obtained are practically satisfactory in heat resistance, electrical properties and chemical resistance as those for use in making a printed wiring board.

The aforementioned surface roughing treatments are usually so-called nodulation treatment effected when a copper foil is produced, and black oxide treatment effected when a multi-layer printed wiring board is prepared. The nodulation treatment is the one which produces very fine roughness, so-called nodules, on the matte surface of a copper foil by plating copper foil with copper. The black oxide treatment is the one which oxidizes a circuit (copper foil) on a circuit-formed substrate with an oxidant thereby to convert the copper on the substrate to spiny copper oxide. The surface to be subjected to black oxide treatment in treatment in this case is the shiny surface (onto which electrodeposition of copper was started) of a copper foil, which was not subjected to nodulation treatment when producing the copper foil. In brief, the shiny surface is that on which a circuit is to be formed.

These treatments false problems, respectively.

The problem raised by the nodulation treatment is that the management of a plating bath for nodulation treatment, and the plating condition are complicated, and the nodules entering inside of a substrate when the copper foil and the substrate are laminated together are apt to remain as etching remnants (copper remnants) on the substrate surface after the formation of a circuit thereon whereby said nodules will be the cause for hindering a very fine pattern from being formed.

The black oxide treatment uses, as a treating solution, a solution of an oxidant such as sodium hypochlorite and the management of the oxidant concentration in the solution and the temperature thereof is complicated since the oxidant decomposes with the progress of the treatment. Further, since the oxidant solution is an alkaline one, copper foils treated with the oxidant solution are required to be washed for example after the treatment whereby this treatment incurs a high cost for the washing and the like, this being industrially disadvantageous. Furthermore, in the production of a multilayer printed wiring board, the copper foil surface of the inner-layer circuit is covered with copper oxide by being subjected to black oxide treatment, the copper oxide is more easily soluble in hydrochloric acid or the like than copper, and the copper oxide raises a problem that it is erroded with hydrochloric acid or the like whereupon a so-called haloing phenomenon is apt to be presented in the course of forming through-holes for connecting the inner-layer circuits to the outer-layer circuits. The occurrence of such a haloing phenomenon is apt to lower the insulating properties and interlayer connection reliability. A so-called double-treated copper foil both the sides of which have been subjected to roughing treatment has been proposed to be used as an alternative method for dispensing with the black oxide treatment, but the alternative method has not yet been widely used since it causes a copper foil cost to be raised and makes the formation of a very fine circuit difficult due to forming such a circuit on the roughed surface of the double-treated copper foil.

SUMMARY OF THE INVENTION

The object of this invention is to provide an adhesive which is excellent to handle and securely adheres to the surface of a copper foil thereby to ensure a secure bond between the copper foil and a substrate, and also to provide a copper foil with the adhesive applied thereon.

The present inventors have already proposed an adhesive comprising an epoxy resin, rubber or a rubber-modified epoxy resin and a polyacetal resin, as well as a copper foil with said adhesive coated thereon (Japanese patent application No. Hei 6-243430 or No. 243430/94). The adhesive and the adhesive-coated copper foil disclosed herein (in said patent application) can adhere onto a substrate at lower temperature and pressure than conventional ones. Since lamination by a press was not intended at that time, however, there was raised a problem that the resin runs out of the adhesive in a remarkable amount and secure adhesion to the substrate cannot be obtained, when the copper foil is laminated to ordinary epoxy resin-impregnated glass fiber prepregs. This invention has solved this problem.

The present inventors found an adhesive which allows resins to run out thereof in a lessened amount even when a copper foil and a substrate are bonded to each other with an adhesive under pressure and temperature by a press, and can securely adhere to the surface of a copper foil even if the copper foil has not been subjected to surface roughing treatment. This invention is based on this finding.

The object of this invention may be achieved by providing an adhesive comprising, by weight, 40–70% of an epoxy resin, 20–50% of a polyvinyl acetal resin and 0.1–20% of a melamine resin or urethane resin, all of said resins totalling 100%, with the proviso that 5–80% by weight of said epoxy resin is a rubber-modified epoxy resin.

The epoxy resin used in this invention may be any one of those which are commercially available for use in forming laminates and electronic parts. The epoxy resin includes a bisphenol A-type epoxy resin, a bisphenol F-type epoxy resin, a novolak-type epoxy resin, an o-cresol novolak-type epoxy resin, a glycidyl amine compound such as triglycidyl isocyanurate or N,N-diglycidyl aniline, a glycidyl ester compound such as a tetrahydrophthalic acid diglycidyl ester or a brominated epoxy resin such as a tetrabromobisphenol A type epoxy resin. These epoxy resins may be used singly or jointly and, further, they have no particular limits in polymerization degree and epoxy equivalent.

Preferable curing agents for the epoxy resins include generally known dicyandiamide, latent curing agents such as organic hydrazides and imidazole, and a phenol novolak resin which is difficultly curable at room temperature.

The optimum amounts of these curing agents added to the respective epoxy resins are known, and these curing agents may be varied in amount added as far as an acceptable curing effect is ensured. Further, they may be used singly or jointly. Furthermore, an epoxy resin cure accelerator such as a tertiary amine, may preferably be used together with the curing agent.

The amount of the epoxy resin component contained in the adhesive of this invention is 40–70% by weight of the total amount of all the resin components. If the amount of the epoxy resin component contained in an adhesive is less than 40% by weight then the resulting printed wiring board using such an adhesive therein will be deteriorated in electrical properties and heat resistance, while if the amount thereof contained in an adhesive is more than 70% by weight then such an adhesive will permit too much of the resin to run out thereof when a multilayer printed wiring board is produced by lamination by a press, whereby the resulting bond between layers will be lowered.

The rubber-modified epoxy resins used as a part of the epoxy resin in the adhesive of this invention may be commercially available ones for use in adhesives and paints. They may be used in this invention without any particular restrictions and are exemplified by "EPICLON TSR-960" (tradename), produced by Dai Nippon Ink Co., Japan, "EPOTOHTO YR-102" (tradename), produced by Tohto Kasei Co., Japan, "SUMIEPOXY ESC-500" (tradename), produced by Sumitomo Chemicals Co., Japan and "EPOMIK VSR 3531" (tradename), produced by Mitsui Petrochemicals Co., Japan. These rubber-modified epoxy resins may be used singly or jointly and may be used in the adhesive of this invention in an amount of 5–80% by weight of the whole epoxy resin. The use of the rubber-modified epoxy resin in the adhesive will remarkably increase the adhesive in adhesiveness to the surface of a copper foil which is not subjected to surface roughing treatment. If, however, this modified resin is used in an amount of less than 5% by weight of the whole epoxy resin then such an increase in adhesiveness will not be achieved, while if it is used in an amount of more than 80% by weight thereof then the resulting adhesive will be lowered in heat resistance.

The polyvinyl acetal resin used as one of the components of the adhesive of this invention, may be a resin which is synthesized by reacting polyvinyl alcohol with an aldehyde. At the present a reaction product of polyvinyl alcohol having various degrees of polymerization with at least one kind of an aldehyde is commercially available for use in paints and adhesives. Such a reaction product may be used as a polyvinyl acetal resin without any particular limits in kind of an aldehyde and degree of acetalization. Polyvinyl alcohol which is one of the starting or raw materials, has no particular limits in degree of polymerization, but it is preferable that the polyvinyl alcohol have a polymerization of 2000–3500 in view of the heat resistance and solvent solubility of the resulting adhesive. Further, modified polyvinyl acetal resins wherein carboxyl groups or the like have been introduced into the molecules are also commercially available, and they may be used without any particular restrictions if they do not raise problems as to their compartibility with an epoxy resin to be used in combination. The amount of the polyvinyl acetal resin to be contained in the adhesive of this invention is 20–50% by weight of the total amount of the resin components. If the amount thereof used is less than 5% by weight then no effects of inhibiting the resin components from running out of the resulting adhesive will be exhibited as is understood from the foregoing, while if the amount used is more than 50% by weight then the resulting printed wiring board will be deteriorated in waterproofing since the adhesive obtained increases in water absorbability after cured.

In addition to the above-mentioned resin components, a melamine or a urethane resin may be used as a cross-linking agent for the polyvinyl acetal resin in the preparation of the adhesive of this invention.

The melamine resin used herein may be a commercially available alkyletherated melamine resin and is exemplified by a methylated melamine resin, a n-butylated melamine resin, an iso-butylated melamine resin or a mixed etherated melamine resin thereof. These melamine resins have no particular limits in molecular weight and degree of alkyletheration for use in the adhesive of this invention.

The urethan resin used in this invention may be a commercially available resin for adhesives and paints which contains an isocyanate group in the molecule. The urethane resin includes a reaction product of a polycyanate compound such as toluenediisocyanate, diphenylmethanediisocyanate or polymethylene-polyphenylpolyisocyanate, with a polyol such as trimethylolpropane, polyetherpolyol or polyesterpolyol. These compounds are highly reactive as a resin and may often be polymerized with the moisture in the atmosphere, and, thus, they are stabilized with a phenolic compound or an oxime to produce a urethane resin which is called "a block isocyanate", this urethane resin so called being preferred to use.

The amount of the melamine resin or urethane resin contained in the adhesive of this invention is 0.1–20% by weight of the total amount of all the resin components. If the amount is less than 0.1% by weight then the cross-linking of the polyvinyl acetal resin will be insufficient thereby to lower the resulting adhesive in heat resistance, while if the amount is more than 20% by weight then the resulting adhesive will lower in adhesiveness to a copper foil which has not been subjected to surface roughing treatment.

The adhesive of this invention prepared by mixing said resin components in their respective predetermined amounts is dissolved in a solvent to obtain an adhesive composition for practical use. The solvents which may be used are not particularly limited, but it is preferable to use an industrially inexpensive solvent such as methyl ethyl ketone or toluene. The solvents may be used singly or jointly.

The adhesive composed of said resin components according to this invention may be further incorporated with inorganic fillers typified by talc and aluminum hydroxide and with additives such as an anti-foaming agent, a levelling agent and a coupling agent as desired. These fillers and additives are effective for improving the resulting adhesive in smoothness and fire-retardation and for lowering a cost of adhesives.

According to this invention, said adhesive composition is coated directly on a substrate and then freed from the solvent to obtain a semi-cured adhesive layer-formed substrate to which a copper foil is then applied by a press, or said adhesive composition is treated to remove the solvent therefrom thereby to form a filmy or sheet-like adhesive for use as an adhesive between a copper foil and a substrate, or else said adhesive composition is coated on a copper foil and then heated to obtain a semi-cured adhesive-coated copper foil for use in adhering to a substrate. The amount of the adhesive composition coated is not particularly limited.

The copper foils used for adhesive-coated copper foil may be a rolled or electrodeposited copper foil and have a thickness of preferably 9–100 μm, more preferably 12–35 μm and adhesive is semi-cured by heat. They need not undergo surface roughing treatment, but they may undergo passivation treatment to prevent them from causing their discoloration due to the oxidation of their surface. Any of passivation methods may be adopted in this case.

DESCRIPTION OF THE PREFERRED EMBODIMENTS

The invention will be better understood by the following Examples and Comparative Examples wherein a non-modified epoxy resin is called simply as "an epoxy resin", while an epoxy resin which has been modified with rubber is called "a rubber-modified epoxy resin".

EXAMPLE 1

In a 1:1 toluene/methanol mixed solvent were dissolved 40 parts by weight of an epoxy resin (tradename: EPOMIC R-301, produced by Mitsui Petro-Chemicals Co.), 20 parts by weight of a rubber-modified epoxy resin (tradename: EPOTOHTO YR-102, produced by Tohto Kasei Co.), 30 parts by weight of a polyvinyl acetal resin (tradename: DENKA BUTYRAL No. 5000A, produced by Denki Kagaku Kogyo Co.), 10 parts by weight 5 of a melamine resin as solid matter (tradename: U-VAN 20 SB, produced by Mitsui Toatsu Chemical Co.), 2 parts by weight of a latent curing agent (dicyandiamide: reagent) for epoxy resins (added as a 25 wt. % solution of the agent in dimethylformamide) and 0.5 parts by weight of a cure accelerator (tradename: CURESOL 2E4MZ, produced by Shikoku Kasei Co.), thereby to prepare an adhesive composition containing 25% by weight of solid matter.

The adhesive composition so prepared was coated on the matte surface of a 35 μm-thick electrodeposited copper foil which was not subjected to surface roughing treatment, dried in air and then heated at 150° C. for 7 minutes thereby to prepare an adhesive-coated copper foil. The thickness of the adhesive so attached was 30 μm at this time. Eight (8) sheets of a commercially available 0.2 mm-thick glass epoxy prepreg were placed one upon another on the adhesive-coated side of the copper foil, and the whole was pressed together at 30 kg/cm² and 170° C. for 60 minutes to obtain a copper foil/substrate (prepregs) laminate.

EXAMPLE 2

The procedure of Example 1 was followed except that a rubber-modified epoxy resin (tradename: EPICLON TSR-960, produced by Dai Nippon Ink Co.) was substituted for the rubber-modified epoxy resin (tradename: EPOTOHTO YR-102, produced by Tohto Kasei Co.) used in Example 1, thereby to prepare a 30 μm thick adhesive-coated copper foil and then obtain a copper foil/substrate laminate.

EXAMPLE 3

The procedure of Example 1 was followed except that a urethan resin (tradename: CORONATE AP-STABLE, produced by Nippon Polurethane Co.) was substituted for the melamine resin (tradename: U-VAN 20SB, produced by Mitsui Toatsu Chemical Co.) used in Example 1, thereby to prepare a 30 μm thick adhesive-coated copper foil and then obtain a copper foil/substrate laminate.

EXAMPLE 4

The adhesive composition prepared in Example 1 was coated on a polyethylene terephthalate film, dried in air and then heated at 150° C. for 7 minutes, after which the whole was cooled at room temperature and then the polyethylene terephthalate film was peeled from the whole thereby to obtain a filmy adhesive. The filmy adhesive so obtained was 50 μm in thickness and had no stickiness at room temperature.

Said filmy adhesive was sandwiched in between the matte surface of a 35 μm thick electrodeposited copper foil without lrs surface being roughed and eight sheets of 0.2 mm thick epoxy resin-impregnated glass fiber prepregs as material for a substrate, and the whole was then pressed together at 30 kg/cm² and 170° C. for 60 minutes thereby to prepare a copper foil/substrate laminate.

COMPARATIVE EXAMPLE 1

Using a non-surface roughed 35 μm thick electrodeposited copper foil in substitution for the adhesive-coated copper foil prepared in Example 1, eight sheets of 0.2 mm thick epoxy resin-impregnated glass fiber prepregs as material for a substrate were placed one upon another on the matte surface of said non-surface roughed copper foil, and the whole was pressed together at 30 kg/cm² and 170° C. for 60 minutes thereby to prepare a copper foil/substrate laminate.

COMPARATIVE EXAMPLE 2

The procedure of Example 1 was followed except that an epoxy resin (tradename: EPOTOHTO YD-128, produced by Tohto Kasei Co.) was substituted for the rubber-modified epoxy resin (tradename: EPOTOHTO YR-102, produced by Tohto Kasei Co.), thereby to prepare an adhesive composition.

Using the adhesive composition so prepared, a copper foil with a 30 μm thick adhesive layer attached thereto was prepared in the same manner as in Example 1, and, further, using the adhesive-coated copper foil so prepared, a copper foil/substrate laminate was obtained in the same manner as in Example 1.

COMPARATIVE EXAMPLE 3

The procedure of Example 1 was followed except that a phenolic resin (tradename: SHONOL BLS-364, produced by Showa High Molecular Co.) was substituted for the melamine resin (tradename: U-VAN 20SB, produced by Mitsui Toatsu Chemical Co.), thereby to prepare an adhesive-applied copper foil with a 30 μm thick adhesive layer attached thereto and then obtain a copper foil/substrate laminate.

Then, the laminates obtained in Examples 1–4 and Comparative Examples 1–3 were evaluated for the following properties with the results being shown in Table 1.

1. Normal-state peel strength (10 mm width, According to JIS C 6481)

2. Post-soldering peel strength (10 mm width, According to JIS C 6481)

3. Solder heat resistance (According to JIS C 6481)

TABLE 1

|  | Peel strength normal state (kgf/cm) | Peel strength after soldering (S3) (kgf/cm) | Solder heat resistance (Sec.) |
| --- | --- | --- | --- |
| Example 1 | 1.56 | 1.52 | 120 or more |
| Example 2 | 1.46 | 1.44 | 120 or more |
| Example 3 | 1.49 | 1.44 | 120 or more |
| Example 4 | 1.44 | 1.41 | 120 or more |
| Comp. Ex. 1 | 0.26 | 0.22 | 120 or more |
| Comp. Ex. 2 | 0.85 | 0.77 | 120 or more |
| Comp. Ex. 3 | 1.03 | 0.99 | 120 or more |

Note: Comp. Ex. = Comparative Example

It is seen from the results of Table 1 that the laminates obtained in the Examples each satisfy a peel strength of at least 1.4 kgf/cm (normal state and after soldering) prescribed in JIS C 6482. This clearly indicates that there can be obtained a printed wiring board in which the copper foil and the substrate are excellently adhered to each other, by using the adhesive for a copper foil and the adhesive-applied copper foil each of this invention.

(Effects of this invention)

It becomes possible to effect an excellent bond between a copper foil and a substrate without subjecting the copper foil to surface roughing treatment, by using an adhesive of this invention. Thus, this invention can dispense with nodulation treatment to be effected at the time of preparing a copper foil and black oxide treatment to be effected at the time of preparing a multilayer printed wiring board. Therefore, the use of the adhesive-applied copper foils of this invention in the preparation of laminates for printed wiring boards will make it possible to obtain printed wiring boards having a precise circuit formed thereon and multilayer printed wiring boards having high insulation properties and interlayer connection reliability without post-etching copper remnants and presenting haloing phenomena.

What is claimed is:

1. An adhesive-applied copper foil having an adhesive attached onto its one face, the adhesive comprising 40–70% by weight of an epoxy resin, 20–50% by weight of a polyvinyl acetal resin and 0.1–20% by weight of a melamine or urethane resin, all of said resins totalling 100% by weight, with the proviso that 5–80% by weight of said epoxy resin is a rubber-modified epoxy resin.

2. An adhesive-applied copper foil according to claim 1, wherein said epoxy resin is at least one member selected from the group consisting of a bisphenol A epoxy resin, a bisphenol F epoxy resin, a novolak epoxy resin, an o-cresol novolak epoxy resin, a glycidyl amine, a glycidyl ester, and a brominated epoxy resin.

3. An adhesive-applied copper foil according to claim 1, wherein said melamine resin is a member selected from the group consisting of a methylated melamine resin, an n-butylated melamine resin, an iso-butylated melamine resin, and a mixed etherated melamine resin.

4. An adhesive-applied copper foil according to claim 1, wherein said urethane resin is a reaction product of a polycyanine compound with a polyol.

5. An adhesive-applied copper foil according to claim 1, wherein said adhesive further contains at least one additive which is a member selected from the group consisting of an inorganic filler, an anti-foaming agent, a levelling agent, and a coupling agent.

* * * * *